United States Patent
McMillan et al.

(10) Patent No.: US 10,584,223 B2
(45) Date of Patent: Mar. 10, 2020

(54) OPTICAL MEMBER, OPTICAL SEMICONDUCTOR DEVICE, AND ILLUMINATION APPARATUS

(71) Applicants: Dow Corning Toray Co., Ltd., Tokyo (JP); Dow Corning Corporation, Midland, MI (US)

(72) Inventors: Christopher S. McMillan, Midland, MI (US); Kazutaka Mori, Kagawa (JP); Hiroaki Yoshida, Chiba (JP); Shin Yoshida, Chiba (JP)

(73) Assignees: Dow Toray Co., Ltd., Tokyo (JP); Dow Silicones Corporation, Midland, MI (US)

( * ) Notice: Subject to any disclaimer, the term of this patent is extended or adjusted under 35 U.S.C. 154(b) by 163 days.

(21) Appl. No.: 15/520,189

(22) PCT Filed: Oct. 16, 2015

(86) PCT No.: PCT/JP2015/005238
§ 371 (c)(1),
(2) Date: Apr. 19, 2017

(87) PCT Pub. No.: WO2016/063509
PCT Pub. Date: Apr. 28, 2016

(65) Prior Publication Data
US 2017/0306120 A1    Oct. 26, 2017

Related U.S. Application Data

(60) Provisional application No. 62/065,972, filed on Oct. 20, 2014.

(51) Int. Cl.
*H01L 33/56* (2010.01)
*H01L 33/58* (2010.01)
(Continued)

(52) U.S. Cl.
CPC .............. *C08J 7/126* (2013.01); *H01L 33/56* (2013.01); *H01L 33/58* (2013.01);
(Continued)

(58) Field of Classification Search
CPC ........ H01L 33/56; H01L 33/58; C08J 2383/16
(Continued)

(56) References Cited

U.S. PATENT DOCUMENTS 4,491,653 A   1/1985   McGinniss et al.
8,194,326 B2  6/2012   Kraeuter et al.
(Continued)

FOREIGN PATENT DOCUMENTS

EP    2246386 A1     11/2010
JP    S59218830 A    12/1984
(Continued)

OTHER PUBLICATIONS

PCT/JP2015/005238 International Search Report dated Jan. 1, 2016, 2 pages.
(Continued)

*Primary Examiner* — Tri V Nguyen
(74) *Attorney, Agent, or Firm* — Warner Norcross + Judd LLP

(57) ABSTRACT

The present invention provides an optical member comprising a silicone material having excellent antifouling property while having good light transmittance, heat resistance, and strength, and an optical semiconductor device and illumination apparatus having excellent antifouling property. The present invention is an optical member comprising a silicone material containing a fluorinated surface, the proportion of F atoms being from 0.1 to 45 at % and/or the ratio of F atoms relative to C atoms being from 0.01 to 1.00 in the atomic composition percentage according to X-ray photoelectron spectroscopy (XPS) of the fluorinated surface.

17 Claims, 2 Drawing Sheets

(51) Int. Cl.
*C08J 7/12* (2006.01)
*C08J 7/16* (2006.01)

(52) U.S. Cl.
CPC ........ *C08J 2383/04* (2013.01); *C08J 2383/16* (2013.01); *H01L 2224/48091* (2013.01); *H01L 2224/48247* (2013.01); *H01L 2224/73265* (2013.01); *H01L 2924/181* (2013.01)

(58) Field of Classification Search
USPC ............ 257/98; 252/301.35, 301.16; 428/1.1
See application file for complete search history.

(56) References Cited

U.S. PATENT DOCUMENTS

| | | | |
|---|---|---|---|
| 2010/0220396 A1* | 9/2010 | Kraeuter | ................... C08J 7/12 359/642 |
| 2012/0003467 A1* | 1/2012 | Suzuki | ................... B32B 33/00 428/336 |
| 2012/0237684 A1* | 9/2012 | Ohmi | ..................... C08J 7/126 427/341 |
| 2015/0218329 A1* | 8/2015 | Ishihara | ................... C09D 5/00 428/409 |
| 2015/0274938 A1* | 10/2015 | Okawa | ................... C08L 83/00 257/100 |
| 2017/0044340 A1* | 2/2017 | Farah | ....................... C08J 7/04 |

FOREIGN PATENT DOCUMENTS

| | | | | |
|---|---|---|---|---|
| JP | 64066245 | A | 3/1989 | |
| JP | 2005296500 | A | 10/2005 | |
| JP | 2005325176 | A | 11/2005 | |
| JP | 2014122274 | A | 7/2014 | |
| WO | WO-2014034030 | A1 * | 3/2014 | .............. C09D 5/00 |
| WO | WO2014046310 | A1 | 3/2014 | |

OTHER PUBLICATIONS

English language abstract and machine translation for JPS59218830 (A) extracted from http://worldwide.espacenet.com database on Apr. 19, 2017, 6 pages.
English language abstract and machine translation for JP2005296500 (A) extracted from http://worldwide.espacenet.com database on Apr. 19, 2017, 17 pages.
English language abstract and machine translation for JP2005325176 (A) extracted from http://worldwide.espacenet.com database on Apr. 24, 2017, 13 pages.
English language abstract and machine translation for JP2014122274 (A) extracted from http://worldwide.espacenet.com database on Apr. 19, 2017, 17 pages.
English language abstract and machine translation for JP64066245 (A) extracted from http://worldwide.espacenet.com database on Apr. 27, 2017, 5 pages.

* cited by examiner

OPTICAL MEMBER, OPTICAL SEMICONDUCTOR DEVICE, AND ILLUMINATION APPARATUS

CROSS-REFERENCE TO RELATED APPLICATIONS

This application is the National Stage of International Application No. PCT/JP2015/005238 filed on 16 Oct. 2015, which claims priority to and all advantages of U.S. Provisional Patent Application No. 62/065,972 filed on 20 Oct. 2014, the content of which is hereby incorporated by reference.

TECHNICAL FIELD

The present invention relates to an optical member, an optical semiconductor device, and an illumination apparatus.

BACKGROUND ART

Silicone materials have been recently used in sealing materials and covering materials of (optical) electronic parts such as semiconductors, transistors, integrated circuits (ICs), and light-emitting diodes (LEDs). However, such silicone materials have the problem of poor antifouling property because they are sticky on the surface.

On the other hand, a known method for reducing stickiness of the surface of silicone materials is to treat the surface thereof with fluorine gas (refer to Patent Documents 1 and 2). However, when silicone material is surface-treated with fluorine gas, its transparency decreases and its strength changes, and there have been no studies on silicone materials for optical members that have excellent antifouling property while having good light transmittance, heat resistance, and strength.

CITATION LIST

Patent Literature

Patent Document 1: Japanese Unexamined Patent Application Publication No. S64-66245A
Patent Document 2: Japanese Unexamined Patent Application Publication No. 2005-325176A

SUMMARY OF INVENTION

Technical Problem

An object of the present invention is to provide an optical member comprising a silicone material having excellent antifouling property while having good light transmittance, heat resistance, and strength, and an optical semiconductor device and illumination apparatus having excellent antifouling property.

Solution to Problem

A summary of the present invention is as follows.

(1) An optical member comprising a silicone material containing a fluorinated surface, the proportion of F atoms being from 0.1 to 45 at % and/or the ratio of F atoms relative to C atoms being from 0.01 to 1.00 in the atomic composition percentage according to X-ray photoelectron spectroscopy (XPS) of the fluorinated surface.

(2) The optical member according to (1), wherein the surface of the silicone material has been fluorinated by a gas containing at least fluorine gas.

(3) The optical member according to (1) or (2), wherein the silicone material contains an Si—R—Si bond (wherein R is an alkylene group or an arylene group) in the structure.

(4) An optical semiconductor device constituted from at least a light-emitting element and an optical member that seals or covers the element, the optical member being an optical member described in any one of (1) to (3).

(5) An illumination apparatus constituted from at least a light source and an optical member through which light emitted from the light source is transmitted, the optical member being an optical member described in any one of (1) to (3).

Advantageous Effects of Invention

The optical member of the present invention is characterized by having excellent antifouling property while having good light transmittance, heat resistance, and strength. Furthermore, the optical semiconductor device and illumination apparatus of the present invention are characterized by having excellent antifouling property.

DESCRIPTION OF EMBODIMENTS

Figure 1:
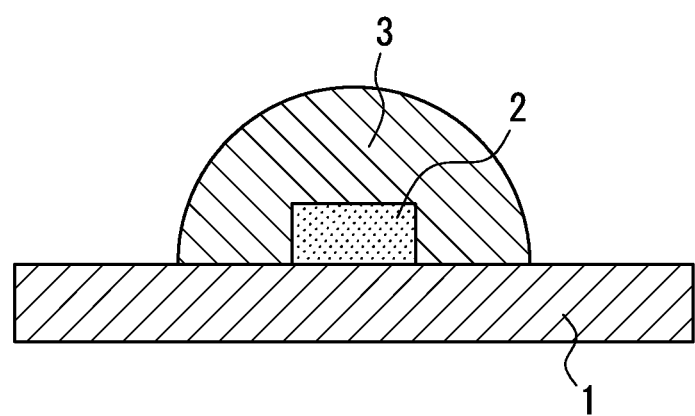
FIG. 1 is a cross-sectional view of an LED that is an example of an optical semiconductor device of the present invention.

The present invention will now be described in detail.
Optical Member

The optical member of the present invention is characterized by comprising a silicone material containing a fluorinated surface, the proportion of F atoms being from 0.1 to 45 at % and/or the ratio of F atoms relative to C atoms being from 0.01 to 1.00 in the atomic composition percentage according to X-ray photoelectron spectroscopy (XPS) of the fluorinated surface.

The silicone material used in the present invention is not particularly limited, and may be a silicone material suitable for the application.

For example, a silicone material cured by an addition reaction, a silicone material cured by a condensation reaction, a silicone material cured by a radical reaction using an organic peroxide, a thermoplastic silicone material, and a curable silicone material may be used.

In particular, the optical member of the present invention preferably comprises a silicone material cured by an addition reaction because excellent light transmittance, heat resistance, and strength can be realized.

The silicone material used in the present invention preferably has an Si—R—Si bond in its structure. This is because a silicone material that has such a bond can maintain transparency even when the surface thereof has been fluorinated.

In the formula, R is an alkylene group or an arylene group. Examples of the alkylene group include alkylene groups having from 2 to 12 carbons, such as a methylmethylene group, an ethylene group, a propylene group, a methylethylene group, a butylene group, and an isobutylene group. Examples of the arylene group include arylene groups having from 6 to 12 carbons, such as a phenylene group, a tolylene group, a xylylene group, and a naphthylene group.

As a first characteristic of the optical member of the present invention, the ratio of F atoms relative to C atoms is from 0.01 to 1.00 in the atomic composition percentage according to X-ray photoelectron spectroscopy (XPS) of the surface of the silicone material. This is because when the ratio of F atoms relative to C atoms is not less than the lower limit of the above range, the surface of the silicone material can be provided with sufficient antifouling property, while on the other hand, when not greater than the upper limit of the above range, there is no loss of transparency of the silicone material.

As a second characteristic of the optical member of the present invention, the proportion of F atoms on the surface of the silicone material is from 0.1 to 45 at % in the atomic composition percentage according to X-ray photoelectron spectroscopy (XPS). This is because when the proportion of F atoms is not less than the lower limit of the above range, the surface of the silicone material can be provided with sufficient antifouling property, while on the other hand, when not greater than the upper limit of the above range, there is no loss of transparency of the silicone material.

When a silicone material having low gas permeability, specifically a phenyl group-containing silicone material, is used as the silicone material used in the present invention, the ratio of F atoms relative to C atoms in the atomic composition percentage according to X-ray photoelectron spectroscopy (XPS) of the surface of the fluorinated silicone material is not less than 0.001 and preferably not less than 0.01, and is also not greater than 1.00 and preferably not greater than 0.80 or not greater than 0.60. This is because when the ratio of F atoms relative to C atoms is not less than the lower limit of the above range, the surface of the fluorinated silicone material can be provided with sufficient antifouling property, while on the other hand, when not greater than the upper limit of the above range, there is no loss of transparency of the fluorinated silicone material.

The proportion of F atoms in the atomic composition percentage according to X-ray photoelectron spectroscopy (XPS) of the surface of the above fluorinated silicone material is not less than 0.1 at % and preferably not less than 1 at % or not less than 2 at %, and is also not greater than 45 at % and preferably not greater than 40 at % or not greater than 35 at %. This is because when the proportion of F atoms is not less than the lower limit of the above range, the surface of the silicone material can be provided with sufficient antifouling property, while on the other hand, when not greater than the upper limit of the above range, there is no loss of transparency of the silicone material.

An addition reaction-curable silicone composition that forms such a phenyl group-containing silicone material can be purchased as, for example, OE-6630, OE-6636, OE-6662, and the like manufactured by Dow Corning Toray Co., Ltd.

On the other hand, when a silicone material having high gas permeability, specifically a silicone that does not contain a phenyl group, is used as the silicone material used in the present invention, the ratio of F atoms relative to C atoms in the atomic composition percentage according to X-ray photoelectron spectroscopy (XPS) of the surface of the fluorinated silicone material is not less than 0.001 and preferably not less than 0.01, and is also not greater than 1.00 and preferably not greater than 0.50, not greater than 0.40, or not greater than 0.30. This is because when the ratio of F atoms relative to C atoms is not less than the lower limit of the above range, the surface of the fluorinated silicone material can be provided with sufficient antifouling property, while on the other hand, when not greater than the upper limit of the above range, there is no loss of transparency of the fluorinated silicone material.

The proportion of F atoms in the atomic composition percentage according to X-ray photoelectron spectroscopy (XPS) of the surface of the above fluorinated silicone material is not less than 0.1 at % and preferably not less than 1 at %, and is also not greater than 45 at % and preferably not greater than 40 at %, not greater than 30 at %, or not greater than 20 at %. This is because when the proportion of F atoms is not less than the lower limit of the above range, the surface of the silicone material can be provided with sufficient antifouling property, while on the other hand, when not greater than the upper limit of the above range, there is no loss of transparency of the silicone material.

An addition reaction-curable silicone composition that forms such a silicone material not containing a phenyl group can be purchased as, for example, EG-6301, OE-6336, OE-6370HF, MS-1001, MS-1002, MS-1003, and the like manufactured by Dow Corning Toray Co., Ltd.

In the optical member of the present invention, an example of a method for fluorinating the surface of the silicone material is to treat it with a gas containing at least fluorine gas. Examples of the gas containing at least fluorine gas include fluorine gas, mixed gas of fluorine gas and nitrogen gas, mixed gas of fluorine gas and oxygen gas, and mixed gas of fluorine gas and argon gas. When a mixed gas is used, the partial pressure of fluorine gas is preferably from 0.1 to 20 kPa or from 1 to 10 kPa. This is because when the partial pressure of fluorine gas is not less than the lower limit of the above range, the surface of the silicone cured product can be sufficiently fluorinated, while on the other hand, when not greater than the upper limit of the above range, a transparent fluorinated silicone material can be obtained.

The treatment temperature and treatment time when fluorinating the surface of the silicone material are not particularly limited, but preferably, the treatment temperature is from 0 to 100° C. or from 10 to 30° C., and the treatment time is from 0.1 to 3600 seconds or from 5 to 1200 seconds. This is because when the treatment temperature is not less than the lower limit of the above range, the surface of the silicone material can be sufficiently fluorinated, while on the other hand, when not greater than the upper limit of the above range, a transparent fluorinated silicone material can be obtained. This is also because when the treatment time is not less than the lower limit of the above range, the surface of the silicone material can be sufficiently fluorinated, while on the other hand, when not greater than the upper limit of the above range, a transparent fluorinated silicone material can be obtained.

The shape of the optical member of the present invention is not particularly limited, and examples include a sheet shape, a film shape, a fiber shape, a board shape, a spherical shape, a hemispherical shape, a convex lens shape, a concave lens shape, a Fresnel lens shape, a round pillar shape, and a round cylindrical shape. The optical member of the present invention may stand alone, but, for example, it may also be used as a sealing material, an adhesive material, or a covering material of a light-emitting element in an optical semiconductor device, and may also be used as a lens in an optical semiconductor device or as a protecting material or a condenser lens in a solar cell.

Optical Semiconductor Device

The optical semiconductor device of the present invention is constituted from at least a light-emitting element and an optical member that seals or covers the element, the optical member being the optical member described above. Light transmittance, heat resistance, and strength are generally required in optical semiconductor devices, and since a decrease in optical transmittance caused by attachment of dust and dirt may be a serious problem, such a problem can be solved with the optical semiconductor device of the present invention.

The optical semiconductor device of the present invention will now be described in detail by means of FIGS. 1 and 2.

FIG. 1 is a cross-sectional view of an LED that is an example of the optical semiconductor device of the present invention. In this LED, a light-emitting element 2 is mounted on the top face of a substrate 1, and the light-emitting element 2 comprises the optical member of the present invention, and is sealed by a sealing material 3 which also acts as a lens.

Figure 2:
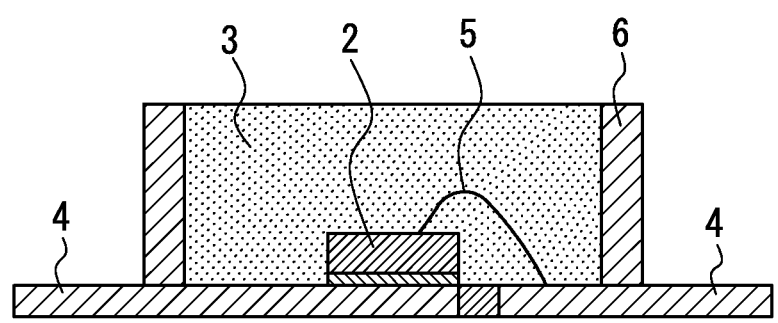
FIG. 2 is a cross-sectional view of another LED that is an example of the optical semiconductor device of the present invention.

FIG. 2 is a cross-sectional view of another LED that is an example of the optical semiconductor device of the present invention. In this LED, a light-emitting element 2 is die-bonded on a lead frame 4', and the light-emitting element 2 and the lead frame 4 are electrically connected by a bonding wire 5. In addition, a frame material 6 is provided around the periphery of the light-emitting element 2, and the light-emitting element 2 is sealed by the sealing material 3 comprising the optical member of the present invention.

Examples of such an optical semiconductor device of the present invention include various LED display devices such as a high-power/high-luminance LED, a surface-mounted PLCC LED, a standard-luminance through-hole LED, an automotive chip LED, a flash LED, and a seven-segment LED, and products that employ these LED display devices such as digital signage, traffic lights, automotive lighting, general lighting, consumer electronics, household electrical appliances, portable devices, and the like.

Illumination Apparatus

The illumination apparatus of the present invention is characterized by being constituted from at least a light source and an optical member through which light emitted from the light source is transmitted, the optical member being the optical member described above. Light transmittance, heat resistance, and strength are generally required in illumination apparatuses, and since a decrease in optical transmittance caused by attachment of dust and dirt may be a serious problem, such a problem can be solved with the illumination apparatus of the present invention.

The illumination apparatus of the present invention will now be described in detail by means of FIG. 3.

This illumination apparatus has the shape of, for example, a light bulb, and a globe 8 comprising the optical member of the present invention is provided so as to surround the light source 7.

Figure 3:
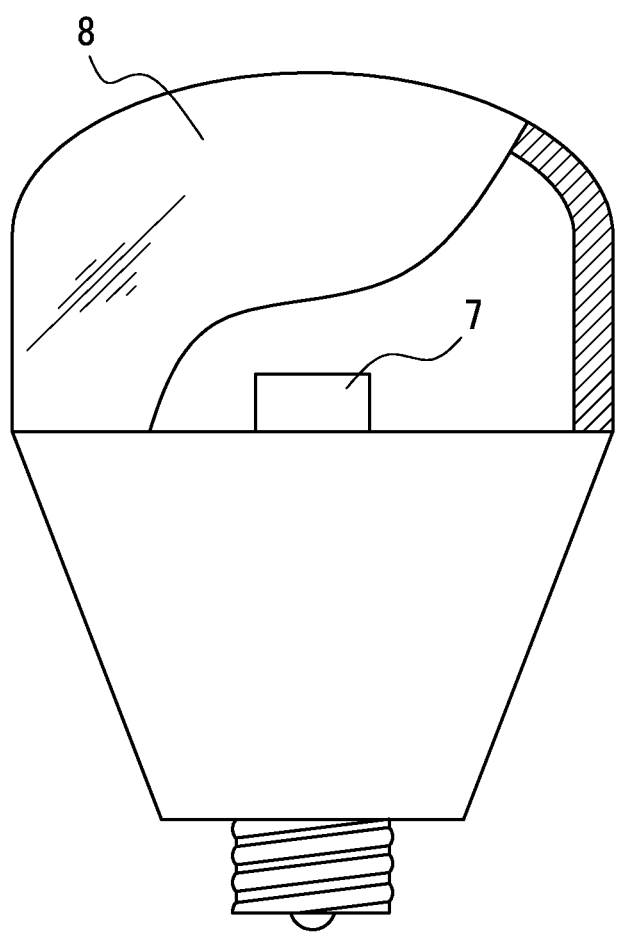
FIG. 3 is a side view containing a partially breaking plane of an illumination apparatus of the present invention.

The optical member in the illumination apparatus of the present invention is not limited to a globe in a light bulb as illustrated in FIG. 3, and is also advantageous as an optical member through which light is transmitted such as a traffic light, a street light, a headlight, or the like.

EXAMPLES

The optical member, the semiconductor device, and the illumination apparatus of the present invention will now be described in detail by means of Examples. Furthermore, the method for producing the silicone cured product and the evaluation methods thereof are as follows.

Production of Cured Product

A curable silicone composition was hot-molded at 150° C. for 15 minutes using a hot press, and then it was post-cured in a 150° C. oven for one hour, to produce a 1-mm-thick sheet-shaped silicone cured product.

Light Transmittance of Cured Product

Using a spectrophotometer (UV-1650PC manufactured by Shimadzu Corporation), light transmittance at wavelength 555 nm of the 1-mm-thick sheet-shaped silicone cured product was measured before and after fluorination.

Powder Adhesion Test of Cured Product

The 1-mm-thick sheet-shaped silicone cured product before and after fluorination was sprinkled with powder (Dyneon (registered trademark) TF Micropowder TF9205 manufactured by Sumitomo 3M Ltd., average particle size 8 µm), and then blown with air, and light transmittance at wavelength 555 nm of the 1-mm-thick sheet-shaped silicone cured product after powder adhesion was measured.

Measurement of Atomic Composition Percentage by X-ray Photoelectron Spectroscopy (XPS)

The atomic composition percentages of the surfaces of the pre-fluorination silicone cured product and the post-fluorination silicone cured product were measured by X-ray photoelectron spectroscopy. Measurement was performed using AXIS Nova manufactured by Kratos Analytical Ltd. Al—K α-rays were used as an X-ray excitation source, using a 150 W monochromator, and an analysis area of 0.4 mm×0.9 mm. The proportion of F atoms and the ratio of F atoms relative to C atoms were determined from the obtained atomic composition percentage values.

Example 1

An addition reaction-curable silicone composition comprising a phenyl group-containing silicone was cured, to produce a 1-mm-thick sheet-shaped silicone cured product. This silicone cured product contained an Si—$C_2H_4$—Si bond in the structure, and its Shore D hardness was 33. A mixed gas of fluorine gas and nitrogen gas (partial pressure of fluorine gas: 4.0 kPa) was put in contact with the silicone cured product at room temperature (25° C.) for 30 minutes, and the surface of the silicone cured product was fluorinated.

The light transmittance of the pre-fluorination silicone cured product was 84%, and the light transmittance of the post-fluorination silicone cured product was 82%, and it was ascertained that the transparency of the silicone cured product was not reduced by fluorination.

In the powder adhesion test of the pre-fluorination silicone cured product, light transmittance was 57%, and in the powder adhesion test of the post-fluorination silicone cured product, light transmittance was 70%, and it was ascertained that the antifouling property of the silicone cured product was improved by fluorination. Furthermore, the proportion of F atoms in the atomic composition percentage according to X-ray photoelectron spectroscopy (XPS) was 32.9 at %, and the ratio of F atoms relative to C atoms was 0.58.

Example 2

An addition reaction-curable silicone composition comprising a phenyl group-containing silicone was cured, to produce a 1-mm-thick sheet-shaped silicone cured product. This silicone cured product contained an Si—$C_2H_4$—Si bond in the structure, and its Shore D hardness was 33. A mixed gas of fluorine gas and oxygen gas (partial pressure of fluorine gas: 1.0 kPa) was put in contact with the silicone cured product at room temperature (25° C.) for 30 minutes, and the surface of the silicone cured product was fluorinated.

The light transmittance of the pre-fluorination silicone cured product was 84%, and the light transmittance of the post-fluorination silicone cured product was 84%, and it was ascertained that the transparency of the silicone cured product was not reduced by fluorination.

In the powder adhesion test of the pre-fluorination silicone cured product, light transmittance was 57%, and in the powder adhesion test of the post-fluorination silicone cured product, light transmittance was 73%, and it was ascertained that the antifouling property of the silicone cured product was improved by fluorination.

Furthermore, the proportion of F atoms in the atomic composition percentage according to X-ray photoelectron spectroscopy (XPS) was 13.5 at %, and the ratio of F atoms relative to C atoms was 0.20.

Example 3

An addition reaction-curable silicone composition comprising a silicone not containing a phenyl group was cured, to produce a 1-mm-thick sheet-shaped silicone cured product. This silicone cured product contained an Si—$C_2H_4$—Si bond in the structure, and its Shore A hardness was 70. A mixed gas of fluorine gas and nitrogen gas (partial pressure of fluorine gas: 4.0 kPa) was put in contact with the silicone cured product at room temperature (25° C.) for 30 minutes, and the surface of the silicone cured product was fluorinated.

The light transmittance of the pre-fluorination silicone cured product was 92%, and the light transmittance of the post-fluorination silicone cured product was 85%, and it was ascertained that the transparency of the silicone cured product was not reduced by fluorination.

In the powder adhesion test of the pre-fluorination silicone cured product, light transmittance was 16%, and in the powder adhesion test of the post-fluorination silicone cured product, light transmittance was 75%, and it was ascertained that the antifouling property of the silicone cured product was improved by fluorination. Furthermore, the proportion of F atoms in the atomic composition percentage according to X-ray photoelectron spectroscopy (XPS) was 11.8 at %, and the ratio of F atoms relative to C atoms was 0.27.

Example 4

An addition reaction-curable silicone composition comprising a silicone not containing a phenyl group was cured, to produce a 1-mm-thick sheet-shaped silicone cured product. This silicone cured product contained an Si—$C_2H_4$—Si bond in the structure, and its Shore A hardness was 70. A mixed gas of fluorine gas and oxygen gas (partial pressure of fluorine gas: 1.0 kPa) was put in contact with the silicone cured product at room temperature (25° C.) for 30 minutes, and the surface of the silicone cured product was fluorinated.

The light transmittance of the pre-fluorination silicone cured product was 92%, and the light transmittance of the post-fluorination silicone cured product was 82%, and it was ascertained that the transparency of the silicone cured product was not reduced by fluorination.

In the powder adhesion test of the pre-fluorination silicone cured product, light transmittance was 16%, and in the powder adhesion test of the post-fluorination silicone cured product, light transmittance was 82%, and it was ascertained that the antifouling property of the silicone cured product was improved by fluorination.

Furthermore, the proportion of F atoms in the atomic composition percentage according to X-ray photoelectron spectroscopy (XPS) was 8.3 at %, and the ratio of F atoms relative to C atoms was 0.15.

Example 5

An addition reaction-curable silicone composition comprising a silicone not containing a phenyl group was cured, to produce a 1-mm-thick sheet-shaped silicone cured product. This silicone cured product contained an Si—$C_2H_4$—Si bond in the structure, and its Shore A hardness was 74. A mixed gas of fluorine gas and nitrogen gas (partial pressure of fluorine gas: 0.5 kPa) was put in contact with the silicone cured product at room temperature (25° C.) for 5 minutes, and the surface of the silicone cured product was fluorinated.

The light transmittance of the pre-fluorination silicone cured product was 91%, and the light transmittance of the post-fluorination silicone cured product was 91%, and it was ascertained that the transparency of the silicone cured product was not reduced by fluorination.

In the powder adhesion test of the pre-fluorination silicone cured product, light transmittance was 63%, and in the powder adhesion test of the post-fluorination silicone cured product, light transmittance was 83%, and it was ascertained that the antifouling property of the silicone cured product was improved by fluorination. Furthermore, the proportion of F atoms in the atomic composition percentage according to X-ray photoelectron spectroscopy (XPS) was 4.9 at %, and the ratio of F atoms relative to C atoms was 0.11.

Example 6

An addition reaction-curable silicone composition comprising a silicone not containing a phenyl group was cured, to produce a 1-mm-thick sheet-shaped silicone cured product. This silicone cured product contained an Si—$C_2H_4$—Si bond in the structure, and its Shore A hardness was 74. A mixed gas of fluorine gas and nitrogen gas (partial pressure of fluorine gas: 2.0 kPa) was put in contact with the silicone cured product at room temperature (25° C.) for 5 minutes, and the surface of the silicone cured product was fluorinated.

The light transmittance of the pre-fluorination silicone cured product was 91%, and the light transmittance of the post-fluorination silicone cured product was 81%, and it was ascertained that the transparency of the silicone cured product was not reduced by fluorination.

In the powder adhesion test of the pre-fluorination silicone cured product, light transmittance was 63%, and in the powder adhesion test of the post-fluorination silicone cured product, light transmittance was 76%, and it was ascertained that the antifouling property of the silicone cured product was improved by fluorination.

Furthermore, the proportion of F atoms in the atomic composition percentage according to X-ray photoelectron spectroscopy (XPS) was 2.3 at %, and the ratio of F atoms relative to C atoms was 0.05.

Comparative Example 1

An addition reaction-curable silicone composition comprising a phenyl group-containing silicone was cured, to produce a 1-mm-thick sheet-shaped silicone cured product. This silicone cured product contained an Si—$C_2H_4$—Si bond in the structure, and its Shore D hardness was 33. A mixed gas of fluorine gas and nitrogen gas (partial pressure of fluorine gas: 4.0 kPa) was put in contact with the silicone cured product at 40° C. for 30 minutes, and the surface of the silicone cured product was fluorinated.

The light transmittance of the pre-fluorination silicone cured product was 84%, and the light transmittance of the post-fluorination silicone cured product was 65%, and it was ascertained that transparency of the silicone cured product was markedly reduced by fluorination.

Furthermore, the proportion of F atoms in the atomic composition percentage according to X-ray photoelectron spectroscopy (XPS) was 47.3 at %, and the ratio of F atoms relative to C atoms was 1.06.

INDUSTRIAL APPLICABILITY

Because the optical member of the present invention has excellent antifouling property while having good light transmittance, heat resistance, and strength, it can be employed in optical semiconductor devices having excellent antifouling property in which the above optical member is used as a sealing material or a coating material of an optical semiconductor element, or in an illumination apparatus containing the above optical member.

REFERENCE SIGNS LIST 1 substrate
2 light-emitting element
3 sealing material
4, 4' lead frame
5 bonding wire
6 frame material
7 light source
8 globe

The invention claimed is:

1. An optical member comprising a silicone material containing a fluorinated surface, the proportion of F atoms being from 2.3 to 32.9 at % and/or the ratio of F atoms relative to C atoms being from 0.05 to 0.58 in the atomic composition percentage according to X-ray photoelectron spectroscopy (XPS) of the fluorinated surface, wherein the silicone material comprises an Si—R—Si bond in the structure with R being an alkylene group or an arylene group, wherein the fluorinated surface of the silicone material has been fluorinated by a gas comprising at least fluorine gas, and wherein the silicone material is formed from an addition reaction-curable silicone composition.

2. The optical member according to claim 1, wherein the proportion of F atoms of the fluorinated surface is from 2.3 to 32.9 at %.

3. The optical member according to claim 1, wherein the ratio of F atoms relative to C atoms of the fluorinated surface is from 0.05 to 0.58 in the atomic composition percentage according to XPS.

4. The optical member according to claim 1, wherein the proportion of F atoms of the fluorinated surface is from 2.3 to 32.9 at % and the ratio of F atoms relative to C atoms of the fluorinated surface is from 0.05 to 0.58 in the atomic composition percentage according to XPS.

5. The optical member according to claim 1, wherein the addition reaction-curable silicone composition comprises a phenyl group-containing silicone.

6. The optical member according to claim 1, wherein R is an alkylene group having from 2 to 12 carbon atoms.

7. The optical member according to claim 6, wherein R is an ethylene group.

8. The optical member according to claim 1, wherein R is an arylene group having from 6 to 12 carbon atoms.

9. The optical member according to claim 1, wherein the gas further comprises nitrogen gas, oxygen gas, or argon gas.

10. The optical member according claim 1, wherein partial pressure of the fluorine gas is from 0.1 to 20 kPa.

11. The optical member according claim 1, wherein treatment temperature when fluorinating the surface of the silicone material is from 0 to 100° C.

12. An optical semiconductor device comprising a light-emitting element and an optical member that seals or covers the light-emitting element, wherein the optical member is according to claim 1.

13. An illumination apparatus comprising a light source and an optical member through which light emitted from the light source is transmitted, wherein the optical member is according to claim 1.

14. An optical member comprising a silicone material containing a fluorinated surface, the proportion of F atoms being from 2.3 to 32.9 at % and/or the ratio of F atoms relative to C atoms being from 0.05 to 0.58 in the atomic composition percentage according to X-ray photoelectron spectroscopy (XPS) of the fluorinated surface, wherein the silicone material is formed from an addition reaction-curable silicone composition and comprises an Si—R—Si bond in the structure with R being an alkylene group having from 2 to 12 carbon atoms or an arylene group having from 6 to 12 carbon atoms, and wherein the fluorinated surface of the silicone material has been fluorinated by a mixed gas comprising fluorine gas and at least one of nitrogen gas, oxygen gas, or argon gas.

15. The optical member according to claim 14, wherein R is an ethylene group.

16. The optical member according to claim 14, wherein partial pressure of the fluorine gas is from 0.1 to 10 kPa.

17. The optical member according to claim 14, wherein treatment temperature when fluorinating the surface of the silicone material is from 10 to 30° C.

* * * * *